United States Patent [19]

Leyrer et al.

[11] Patent Number: 4,649,100
[45] Date of Patent: Mar. 10, 1987

[54] PRODUCTION OF RESIST IMAGES, AND A SUITABLE DRY FILM RESIST

[75] Inventors: Reinhold J. Leyrer, Ludwigshafen; Gerhard Wegner, Denzlingen; Michael Mueller, Waldkirch, all of Fed. Rep. of Germany

[73] Assignee: BASF Aktiengesellschaft, Ludwigshafen, Fed. Rep. of Germany

[21] Appl. No.: 675,428

[22] Filed: Nov. 27, 1984

[30] Foreign Application Priority Data

Nov. 26, 1983 [DE] Fed. Rep. of Germany ....... 3342829
Dec. 23, 1983 [DE] Fed. Rep. of Germany ....... 3346716

[51] Int. Cl.$^4$ .................. G03C 1/495; G03C 5/16; G03F 7/26
[52] U.S. Cl. ...................... 430/326; 430/286; 430/283; 430/285; 430/284; 430/330; 430/945; 430/312; 430/394; 430/327; 430/944; 156/643
[58] Field of Search ............... 430/326, 286, 283, 285, 430/284, 330, 945, 312, 394, 327, 944; 156/643

[56] References Cited

U.S. PATENT DOCUMENTS

| 3,782,939 | 1/1974 | Bonham et al. | 96/35.1 |
|---|---|---|---|
| 3,857,860 | 9/1974 | Ross et al. | 96/91 |
| 4,164,458 | 8/1979 | Patel | 204/159.17 |
| 4,193,797 | 3/1980 | Cohen et al. | 430/258 |
| 4,220,747 | 9/1980 | Preziosi et al. | 526/285 |
| 4,262,073 | 4/1981 | Pampalone et al. | 430/18 |
| 4,314,021 | 2/1982 | O'Brien et al. | 430/270 |
| 4,562,141 | 12/1985 | Tieke | 430/283 |

FOREIGN PATENT DOCUMENTS

| 0022618 | 1/1980 | European Pat. Off. |
|---|---|---|
| 0077577 | 4/1983 | European Pat. Off. |
| 1949208 | 9/1970 | Fed. Rep. of Germany |

OTHER PUBLICATIONS

Copy of European Search Report EP 84 11 4104.
Journal of Polymer Science: Polymer Ltrs. Ed., vol. 16, 607–614, (1978).
Journal of Chem. Phys. 70, 4387–4392 (1979).
Journal of Polymer Science Polymer Letters Edition, vol. 17, 203–208, (1979).
Makromol Chem., Rapid Commun. 3,231–3,237, 3,815–3,819, 3,249–3,254, (1982).

Primary Examiner—John E. Kittle
Assistant Examiner—Cynthia Hamilton
Attorney, Agent, or Firm—Keil & Weinkauf

[57] ABSTRACT

In the production of resist images by application of a radiation-sensitive positive-working resist layer based on degradable polymers onto a substrate, imagewise exposure of the resist layer to actinic radiation and removal of the irradiated parts of the layer with development of the resist image, the radiation-sensitive resist layer used is composed of poly(diacetylenes), in particular soluble ones. Preferably, the radiation-sensitive resist layer based on the poly(diacetylenes) contains sensitizers which can be activated by actinic radiation and which, after being activated, induce or accelerate molecular degradation of the poly(diacetylenes). Dry film resists comprise a temporary dimensionally stable base and a radiation-sensitive resist layer which is applied on the base, can be degraded by exposure to actinic radiation and is based on poly(diacetylenes), in particular soluble ones, with or without a cover sheet on top of the said resist layer.

24 Claims, No Drawings

PRODUCTION OF RESIST IMAGES, AND A SUITABLE DRY FILM RESIST

The present invention relates to a process for the production of imagewise structured resist layers on a substrate, in which a radiation-sensitive resist layer which is applied on the substrate and is based on a degradable polymer is exposed imagewise to actinic radiation, the polymer being degraded in this procedure, and consequently a differentiation between the properties of the irradiated and non-irradiated parts of the resist layer being achieved, the irradiated parts of the resist layer are removed, and, if required, the resulting resist image is then after-treated. The invention furthermore relates to a dry film resist which can be used in this process and which possesses a solid radiation-sensitive positive-working resist layer which is applied on a temporary base, capable of being peeled off or detached, and which can be transferred to a substrate by applying pressure and, if necessary, heat.

Positive-working photosensitive recording materials for the production of imagewise structured resist layers as can be used, for example, in the production of circuit paths, printed circuits, thin-film and multi-film circuits and electronic components, in semiconductor technology, etc., have been described in many publications in the literature. Examples of such positive-working resist materials are those which are based on o-quinonediazide-containing compounds, in particular o-quinonediazide-containing polymers, which react to form alkali-soluble photolysis products when irradiated with actinic light (cf. for example DE-A-No. 20 28 903, DE-A-No. 22 36 914, U.S. Pat. Nos. 3,782,939, 3,837,860 and 4,193,797). Another class of very advantageous positive-working photodegradable resist materials is based on polymers which contain aromatic and/or heteroaromatic o-nitrocarbinol ester groups and which can be washed out with aqueous alkaline developers after exposure (cf. for example DE-A-No. 21 50 691 and DE-A-No. 29 22 746).

With regard to modern applications and the high requirements set, the conventional positive-working photodegradable resist materials and dry film resists have constantly to be improved. For example, the mechanical and chemical stability of some of these resist materials are unsatisfactory for a number of intended uses. Furthermore, the resist materials are frequently required to have higher resolving power.

EP-A-No. 22 618, EP-A-No. 77 577 and U.S. Pat. No. 4,314,021 describe the use of monomeric diacetylenes for the production of photoresist layers. Here, layers, generally multi-stratum, of the monomeric diacetylenes are irradiated imagewise, with the result that photopolymerization is initiated in the irradiated parts. The non-irradiated parts of the resist layer are then removed using a developer. These resist materials exhibit high resolution coupled with high quantum efficiency, and give resist images which possess high mechanical and chemical stability. One of the disadvantages is the fact that the production of these photopolymerizable resist layers of the monomeric diacetylenes is very involved and expensive, the layers preferably being applied onto the substrate by means of the Langmuir-Blodgett technique. Furthermore, these resist materials are negative-working and are only sensitive to actinic light within a restricted wavelength range. However, for many intended uses positive-working resist materials are advantageous, and in many cases broader sensitivity is also desirable.

It is an object of the present invention to provide a novel suitable positive-working radiation-sensitive resist material for use in the conventional processes for the production of resist images by imagewise irradiation and development of radiation-sensitive resist layers, the stated resist material being easy to handle and simple to process and having a high resolving power. It is a further object of the present invention to provide a resist material of this type which gives resist images having good performance characteristics, in particular good mechanical, thermal and chemical stability. It is a further object of the present invention to provide a resist material of this type which furthermore can be used with actinic radiation over a very wide wavelength range and which requires only a short exposure time. It is a further object of the present invention to provide a resist material which possesses the stated properties and can also be processed as a dry film resist.

We have found that these objects are achieved by radiation-sensitive resist layers which can be degraded by the action of actinic radiation, are based on poly(diacetylenes), in particular soluble ones, and, in a particular embodiment, can also contain sensitizers which can be activated by actinic radiation.

The present invention accordingly relates to a process for the production of imagewise structured resist images on a substrate, in which a solid radiation-sensitive resist layer which is applied on the substrate and based on a degradable polymer is exposed imagewise to actinic radiation, the polymer being degraded in this procedure, and consequently selective removal of the irradiated parts of the resist layer being permitted, the irradiated parts of the resist layer are then removed, and, if required, the resulting resist image is then after-treated, wherein the radiation-sensitive resist layer is mainly or completely composed of a poly(diacetylene), in particular a soluble one.

The present invention further relates to a dry film resist, in particular for use in the production of printed circuits, thin-film or multi-film circuits and electronic components, and in semiconductor technology, which possesses a dimensionally stable temporary base, a solid laminatable radiation-sensitive positive-working resist layer which is applied on this base and contains of a degradable polymer, and, preferably, a cover sheet which is present on the radiation-sensitive resist layer and can be removed from the latter without simultaneously removing the temporary base. In the dry film resist, the radiation-sensitive resist layer is mainly or completely composed of a poly(diacetylene), in particular a soluble one.

In a particular, very advantageous embodiment of the novel process or the novel dry film resist, the radiation-sensitive resist layer based on the poly(diacetylenes) contains sensitizers or sensitizer systems which can be activated by actinic radiation and which, after being activated in this way, are capable of inducing or accelerating molecular degradation of the poly-(diacetylenes).

In another, likewise advantageous embodiment of the novel process, the imagewise irradiated resist layer is subjected to a heat treatment before development of the resist image, i.e. before removal of the irradiated parts. This embodiment is used in particular when the radiation-sensitive resist layer does not contain any heat-activable sensitizers for the molecular degradation of the poly(diacetylenes), and high stability of the resist images is desirable.

Other specific and preferred embodiments of the invention follow from the detailed description below.

According to the invention, the radiation-sensitive resist layers are based on poly(diacetylenes). We have surprisingly found that the poly(diacetylenes) in solid layers can be degraded, by irradiation with actinic light, to such an extent as to provide a differentiation between the irradiated and non-irradiated parts which is sufficient for the development of the resist images, and to give resist images which possess crisp and exact contours and do not have any residual layers on the parts of the substrate which have been bared by the development process. This was all the more surprising since, to date, resist images of poly(diacetylenes) have been produced by photopolymerization of monomeric diacetylene layers, i.e. by polymer synthesis using actinic radiation. We have furthermore found that actinic radiation over a very wide wavelength range can be used for the imagewise irradiation of the novel solid resist layers based on the poly(diacetylenes), if the resist layers contain a homogeneous mixture of poly(diacetylenes) and sensitizers which can be activated by radiation and which, after being activated, induce molecular degradation of the poly(diacetylenes). Depending on the choice of the sensitizers or sensitizer systems, it is consequently possible to use actinic radiation in the wavelength range from far ultraviolet to heat radiation and infrared radiation for the production of the resist images. Furthermore, the addition of the sensitizers permits substantial reduction in the time required for the imagewise irradiation of the resist layers, this also increasing the range of application of the resist materials in the processes for the production of the resist images. Using the novel radiation-degradable resist layers based on the poly(diacetylenes), high resolution can be achieved during imagewise structuring, and very stable resist images result.

Advantageously, soluble poly(diacetylenes) are employed for producing the novel resist layers which can be degraded by exposure to actinic radiation, one of the reasons for their use being the relative ease with which they can be processed and handled. The poly(diacetylenes) generally have a weight average molecular weight (determined by light scattering) of from 10,000 to 2,000,000 in particular from 50,000 to 1,000,000. The poly(diacetylenes) used according to the invention are known as such and can be prepared by conventional methods.

According to the invention, particularly useful poly(diacetylenes) are those which are prepared by polymerization of monomeric diacetylenes of the general formula (I)

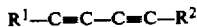  (I)

and accordingly contain repeating structural units of the general formula (II)

  (II)

In the formulae (I) and (II), $R^1$ and $R^2$ can be identical or different and independently of one another are each an organic radical, in particular an aliphatic, aromatic or mixed aliphatic-aromatic radical, in general of 1 to 50 carbon atoms; these radicals can be saturated or unsaturated and unsubstituted or substituted and/or contain, in particular, heteroatoms and/or can be interrupted by heteroatoms or groups containing heteroatoms. Examples of preferred heteroatoms are oxygen, nitrogen and/or sulfur. $R^1$ and $R^2$ are preferably of 10 or more carbon atoms. Particularly preferred radicals $R^1$ and $R^2$ are those which contain ester, amide, sulfonate, urethane and/or urea groups. In the conventional diacetylenes, the radicals $R^1$ and $R^2$ are generally identical.

In the case of the soluble poly(diacetylenes), typical examples of the radicals $R^1$ and $R^2$ in the general formulae (I) and (II) are:

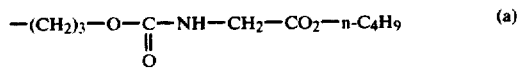 (a)

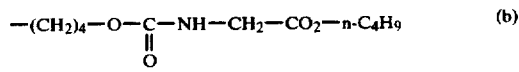 (b)

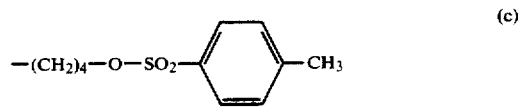 (c)

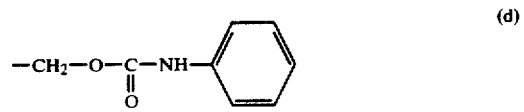 (d)

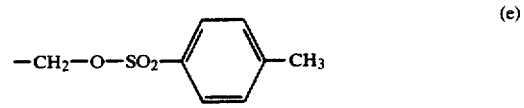 (e)

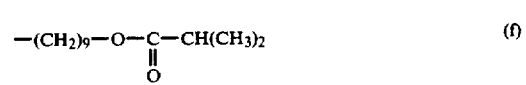 (f)

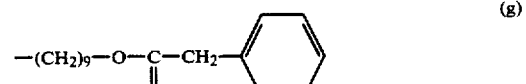 (g)

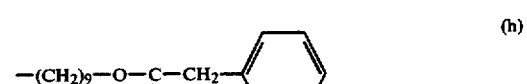 (h)

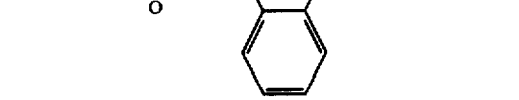 (i)

 (k)

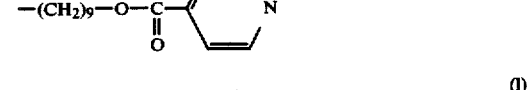 (l)

The corresponding poly(diacemylenes) and their preparation are described in, for example, J. Pol. Sci. Polymer Letters 16 (1978), 607, J. Chem. Phys. 70 (1979), 4387, J. Pol. Sci. Polymer Letters 17 (1979), 203 and Makromol. Chem. Rapid Communications, 3 (1982), 231, 249 and 815. Suitable solvents for the soluble poly(diacetylenes) include methylene chloride, chloroform, dimethylformamide, nitrobenzene, decalin and the like. It has proven particularly advantageous for the novel radiation-degradable resist layers to be produced using poly(diacetylenes) from which the unreacted monomeric diacetylenes, which are generally still present in the polymers after polymerization, have been removed, for example by reprecipitation of the polymers or extraction with a suitable solvent, e.g. acetone.

The poly(diacetylenes) employed according to the invention can be either homopolymers of monomeric diacetylenes or copolymers of 2 or more different monomeric diacetylenes or of one or more monomeric diacetylenes with a minor amount of other conventional comonomers. Preferred poly(diacetylenes) are those which consist exclusively of diacetylene units. The poly(diacetylenes) can be used either alone or as a mixture with one another for the production of the novel radiation-sensitive resist layers. The latter can consist of the poly(diacetylenes) alone, but advantageously also contain additives and/or assistants.

In a preferred embodiment of the invention, the resist layers which can be degraded by exposure to actinic radiation contain, in addition to the poly(diacetylenes), sensitizers or sensitizer systems which can be activated by exposure to actinic radiation and, after being activated, induce or accelerate the molecular degradation of the poly(diacetylenes). The said sensitizers can be those which can be activated by actinic light, in particular in the wavelength range from about 180 to about 800 nm, or those which can be activated by heat radiation, in particular infrared radiation having a wavelength greater than about 0.8 μm.

The sensitizers which can be photoactivated include compounds which directly form reactive free radicals under the action of actinic light, in particular light in the above wavelength range. Azobisisobutyronitrile is an example of such a compound. Other suitable sensitizers which can be photoactivated are compounds which have one or more absorption bands in the wavelength range of actinic light and which, when irradiated with the actinic light, undergo a transition to an excited relatively high-energy state, very often, for example, the triplet state, and, in undergoing a transition out of this excited state, induce or accelerate the degradation of the poly(diacetylenes), either by energy transfer and/or, in particular, via free radical reactions. The sensitizers in this category which can be photoactivated include, for example, xanthene dyes, Rhodamine 6G being one of these dyes which has given particularly advantageous results, thiazinium dyes, e.g. methylene blue, polynuclear quinones and their derivatives, in particular anthraquinone or anthraquinone derivatives, and aryl ketones, in particular benzophenone or mixtures of benzophenone and Michler's ketone.

The sensitizers which can be activated by heat include in general compounds which form reactive free radicals at elevated temperatures, and then effect molecular degradation of the poly(diacetylenes) via a free radical reaction with the latter. The sensitizers which can be activated by heat are, as a rule, therefore compounds which are free radical in nature or decompose under the action of heat to give free radicals, and which react with the poly(diacetylenes) at elevated temperatures. Preferred heat-activable sensitizers are compounds which form free radicals under the action of heat, in particular at from about 40° to 200° C. These include, in particular, the conventional free radical polmerization catalysts, typical examples being azobisisobutyronitrile and benzoyl peroxide.

The novel resist layers based on the poly(diacetylenes) can contain the radiation-activable sensitizers alone or as a mixture with one another. Depending on the type of sensitizers or sensitizer systems used, this results in a large number of possibilities in terms of process engineering and performance characteristics, these possibilities permitting a wide range of embodiments and variations of the process according to the invention. For example, it is possible to use a photoactivable sensitizer which absorbs in the wavelength range from about 250 to 320 nm, i.e. in the range of the characteristic absorption of the poly(diacetylenes). In this case, the photodegradation of the poly(diacetylenes) is accelerated by, for example, a factor of 3 to 4 by the sensitizer. In another embodiment, the photoactivable sensitizers used can have absorption maxima outside the range of the characteristic absorption of the poly(diacetylenes), for example in the wavelength range from about 400 to 800 nm, as in the case of the dyes which absorb in the visible range. In this case, irradiation of the resist layers can be carried out using light sources which are simple to handle, without it being necessary to accept a drop in the quality of the resulting resist image. The use of sensitizers which can be activated by heat makes it possible, for example, to use infrared lasers for the imagewise irradiation of the resist layers. In another embodiment, it is possible to use a mixture of two or more photoactivable sensitizers whose absorption maxima occur in different wavelength ranges. This permits, for example, better and more complete utilization of the emission spectrum of the sources of actinic light. The radiation-sensitive resist layer may also contain a mixture of photoactivable sensitizers and sensitizers which can be activated by heat. This is advantageous for, inter alia, a method comprising repeated irradiation of the resist layers, which is described below, since in this case, with the use of only one image-bearing transparency whose image parts possess a different degree of transparency or opaqueness for actinic radiation of different wavelengths, repeated imagewise irradiation of the resist layer is possible. The radiation-activable sensitizers or sensitizer systems are present in the resist layer based on the poly(diacetylenes) in general in amounts of from 0.001 to 10, preferably from 0.05 to 5, % by weight, based on the total radiation-sensitive resist layer.

The novel radiation-degradable resist layers based on the poly(diacetylenes) can also contain further additives and/or assistants, e.g. plasticizers, pigments, fillers, antioxidants, etc., optionally together with the radiation-activable sensitizers. Plasticizers which have proven particularly useful are dibutyl phthalate, bis-(2-ethylhexyl) phthalate and the like. These further additives and/or assistants are present in the said resist layers in general in amounts of not more than 40, in particular not more than 30, % by weight, based on the total radiation-sensitive resist layer.

The said resist layers can be applied by a conventional method onto the substrates to be protected and/or subsequently to be modified. For example, the radiation-sensitive resist layer can be applied from solution, a solution of the components forming the resist layer, i.e. of the poly(diacetylenes) and any additives and/or assistants used, in a suitable solvent, for example a solvent of the above type, being applied onto the substrate to give a layer of the desired thickness by a conventional coating method, e.g. spin-coating, casting, dip-coating, lip-coating, etc., the solvent being evaporated and the resist layer being dried. This method of coating the substrate from solution is particularly preferable when the photosensitive resist layer is to be kept very thin, the thickness of the dry layer being less than about 0.5-2 μm, preferably from 10 nm to 2 μm. For thicker resist layers, for example from 0.5 to 100 μm, another very advantageous method is the application of a pre-prepared dry resist layer onto the substrate by a conventional lamination procedure, with the use of pressure and, if necessary, heat.

The most advantageous method of applying a preprepared solid radiation-sensitive resist layer onto the substrate is to use a dry film resist (layer-transfer material) which contains the novel radiation-sensitive and radiation-degradable resist layer, based on the poly(diacetylenes), on a temporary dimensionally stable base.

Suitable temporary bases for the dry film resists are the materials which are known per se and conventionally used for this purpose, in particular plastic films or sheets, for example those made of polyesters. The temporary dimensionally stable base generally exhibits moderate adhesion to the radiation-sensitive resist layer based on poly(diacetylenes), this adhesion in particular being less than that of the radiation-sensitive resist layer to the substrate after lamination. This ensures that, after lamination of the said resist layer with the substrate, the temporary base can be peeled off from this resist layer either before or after imagewise irradiation of the latter, without the resist layer being detached once again from the substrate during this procedure. When development of the resist image is carried out with a developer, the temporary dimensionally stable base of the novel dry film resists can also consist of a material which is soluble in the developer, so that in this case there is no need to peel off the temporary base after lamination of the resist layer with the substrate, and hence the difference in adhesion discussed above is also unnecessary. Application of the said resist layer to the temporary dimensionally stable base can likewise be carried out by a conventional method, in particulay from solution, by the application techniques discussed above.

It is advantageous, but not absolutely necessary, for the dry film resist also to contain a cover sheet applied on the free surface of the radiation-sensitive resist layer, this cover sheet serving in particular to protect the said resist layer during handling of the dry film resist. This cover sheet preferably consists of a thin plastic film or sheet, e.g. polyethylene, polypropylene or the like, and its adhesion to the said resist layer should be less than that of the temporary base, so that it can readily be peeled off from the resist layer before the latter is laminated with the substrate. If necessary, an intermediate layer can also be arranged in a conventional manner between the cover sheet and the radiation-sensitive resist layer and between the temporary base and the said resist layer, the said intermediate layer being soluble in the developer used for washing out the imagewise irradiated parts of the resist layer, i.e. for the development of the resist image.

In order to facilitate lamination of the radiation-sensitive resist layer with the substrate when the novel dry film resist is employed, the resist layers used in this case preferably contain a plasticizer. In a preferred embodiment of the process, the said resist layer is pre-exposed uniformly to actinic radiation for a short time from that surface which faces away from the temporary base, i.e. from that side which is laminated with the substrate, this pre-exposure being carried out prior to lamination of the said resist layer with the substrate. This results in a substantial reduction in the time required for the subsequent imagewise irradiation of the resist layer, without this uniform pre-exposure having an adverse effect on the imagewise differentiation and structuring of the resist layer during the main imagewise irradiation. Hence, such a pre-exposure procedure has proven particularly advantageous when dry film resists having radiation-sensitive resist layers which are relatively thick, e.g. a few μm or more, are employed, since otherwise comparatively long irradiation times would be required in these cases in order to achieve image structuring of the resist layer which is faithful to the original, possesses well defined contours and has no residues of the layer remaining on the substrate.

The novel radiation-sensitive resist layers based on the poly(diacetylenes) are partially crystalline when prepared from solution. Because of their high mechanical and chemical stability and, in the absence of heat-activable sensitizers, the high thermal stability, the said resist layers can be kept comparatively thin, their thickness being in general from about 10 nm to 100 μm. The thickness of the said resist layer depends, in a known manner, on the particular intended use. Very thin layers, e.g. from about 10 nm to 2 μm, as are used, for example, in the production of thin-film or multi-film circuits or in semiconductor technology, are applied from solution onto the substrate. On the other hand, it is also possible for thicker layers, e.g. from 0.5 μm to 10 μm or thicker, as are employed in the stated fields of use and, for example, also for the production of printed circuit boards and printed circuits, to be applied in a dry state onto the substrate by the laminating method.

Suitable substrates are the substances conventionally used in this field, the type of substrate being known to depend on the particular intended use of the resist image being produced. The substrate used, for example, for the production of etch resists or plating resists, as required, for example, in the manufacture of printed circuit boards or printed circuits, are copper sheets or copper-plated baseplates. Thin-film or multi-film circuits are produced by processing, in particular, ceramic substrates, coated with metallic or metal oxide layers, or semiconductor elements. Substrates frequently used in semiconductor technology are silicon, GaAs and InSb wafers, which can be provided with an oxide layer or general insulating layer on the surface. It may be useful to treat the substrate with an adhesion promoter before applying the radiation-sensitive resist layer. This is particularly advantageous in semiconductor technology when the substrate used is a silicon wafer or a silicon dioxide-modified wafer; an example of an adhesion promoter which has proven particularly useful in this case is hexamethylenedisilazane.

After the novel radiation-sensitive degradable resist layer based on the poly(diacetylenes) has been applied onto the substrate, the said resist layer is exposed imagewise to actinic radiation in order to produce imagewise structuring to form the desired resist image. The type of actinic radiation depends substantially on the sensitizers or sensitizer systems which may be present in the resist layer. If the resist layer does not contain any sensitizers which induce degradation of the poly(diacetylenes), imagewise irradiation of the resist layer is advantageously carried out using actinic light having a wavelength from about 200 to 450 nm, particular from 250 to 320 nm.

In other cases, the imagewise irradiation of the resist layer can be carried out using either actinic light, in particular light having a wavelength from about 180 nm to 800 nm, or heat radiation, in particular infrared radiation having a wavelength greater than about 0.8 µm, depending on the sensitizers present in the resist layer. The radiation source is advantageously matched up with the sensitizers or sensitizer systems present in the resist layer. Where actinic light is employed, preferred radiation sources are those which have a very high emission in the absorption range of the photoactivable sensitizers. In the case of radiation sources which emit over a broad wavelength range, it is possible for the radiation intensity to be utilized more effectively and completely than has been done to date, by using suitable sensitizers or sensitizer systems.

Accordingly, suitable radiation sources are heat radiators, in particular infrared lamps or infrared lasers, and the conventional sources of actinic light in the ultraviolet and visible wavelength ranges, e.g. incandescent lamps, halogen lamps, low pressure, medium pressure and high pressure mercury lamps which may or may not be doped with, for example, iron or gallium, xenon lamps, fluorescent tubes, superactinic fluorescent tubes, excimer lasers, ultraviolet lasers, etc. The imagewise irradiation of the resist layer can be carried out by means of an imagewise modulated laser beam, or when diffuse radiation is employed, with the use of a suitable image-bearing transparency, for example a photographic negative or positive, whose opaque areas are virtually completely opaque to the actinic radiation used.

The duration of the imagewise exposure of the radiation-sensitive resist layer depends on the composition of the said layer and in particular on the type of poly(diacetylenes) and, where relevant, sensitizers used, as well as on the thickness of this layer, the radiation intensity and the radiation source used. Exposure to actinic radiation induces molecular degradation of the poly(diacetylenes) and consequently results in a differentiation between the properties of the irradiated and non-irradiated parts of the resist layer; hence, the irradiation time is chosen so that, after imagewise irradiation, the irradiated parts can be completely removed by means of a suitable developer. The time for the imagewise irradiation is usually from a few seconds to a few minutes, and the optimum conditions of irradiation can be readily determined in a conventional manner by means of simple preliminary experiments. Where heat radiation is used, it has proven advantageous to carry out the imagewise irradiation of the resist layer in such a way that the irradiated parts are heated to about 40°-200° C. but at least to above the activation temperature of the heat-activable sensitizer present. If, when the novel dry film resists are used, the radiation-sensitive resist layer is pre-exposed uniformly for a short time, as mentioned above, before being laminated with the substrate, the duration of this pre-exposure can be as long as about 70% of the duration of the main imagewise irradiation. The uniform pre-exposure and the main imagewise irradiation can be carried out using the same radiation source or different radiation sources. If, for example, the radiation-sensitive resist layer contains both photoactivable and heat-activable sensitizers, the uniform pre-exposure can be carried out using, for example, infrared radiation, while actinic light can be employed for the main imagewise irradiation, or vice versa.

After the imagewise irradiation of the resist layer and prior to development of the resist image, the resist layer can, if desired, also be subjected to a heat treatment in which the said layer is heated to elevated temperatures, in particular about 50°-200° C. By means of such a heating step, it is possible to increase the degree of crystallinity of the poly(diacetylenes) in the resist layer and hence to improve the stability of the resist layer. If the resist layer contains heat-activable sensitizers which, when activated, would induce the molecular degradation of the poly(diacetylenes), the temperature at which such a heat treatment is carried out must of course be below the activation temperature of the heat-activable sensitizers. Such a heat treatment of the resist layer after the imagewise irradiation is preferably carried out when the resist layer does not contain any heat-activable sensitizers, and the resist image has to meet high requirements in respect of stability, for example even when it is intended to develop the resist image in a dry state by means of a plasma gas. The duration of such a heating step is usually from 10 to 2,000 minutes and is essentially determined by, inter alia, the spectrum of properties which the resist image is required to possess.

After the imagewise irradiation of the resist layer and any subsequent heating step, the irradiated parts of the layer are removed, with development of the resist image. This can be carried out by, for example, washing out the irradiated parts with a developer, e.g. acetone. The washout procedure can be carried out in a conventional manner, for example by spraying, rubbing out or brushing out the imagewise irradiated resist layer with the developer. Another particular advantage of the resist layers employed according to the invention is that, after imagewise irradiation, the development of the resist image can also be carried out in the dry state, for example by plasma or vacuum treatment, instead of with a developer. In the plasma development, the imagewise irradiated resist layer is treated with, for example, a plasma gas such as Ar, $C_2F_2$, $C_2F_4$, $O_2$ or the like, which removes the irradiated, degraded parts of the layer. This dry development by plasma treatment is known in principle as such.

After the development of the resist image by removal of the irradiated parts of the resist layer, the resist image obtained can, if required, also be after-treated. This includes, in particular, drying the resist image after the irradiated parts of the layer have been washed out with a developer. Another example of a suitable after-treatment is heating of the resist image, as has been described above as an intermediate step between the imagewise irradiation and the development of the resist image. Although the heat treatment can be carried out in two steps, i.e. both after the imagewise irradiation and after the development, it has proven reasonable in practice to effect the heat treatment for improving the resistance of the resist layer either after the imagewise irradiation or after the development, a heating step after the development of the resist image preferably being employed when the resist image is developed with a developer and/or, as described below, repeated imagewise irradiation and development of the resist layer are intended.

After the development of the resist image, the bared parts of the substrate can be permanently modified in a conventional manner, for example by metal deposition, etching or doping. The process of imagewise irradiation and development of the resist layer can, if desired, be repeated several times, and the bared parts of the substrate can be modified after each development step and before each further imagewise irradiation. Repeated irradiation hence permits the substrate to be modified repeatedly and in different ways, for example the goldplating of multipin connectors or the production of boards which, in the middle of the circuit paths, possess pressure-point or sliding-contact switches electroplated with noble metals to reinforce them. A particular advantage of the novel radiation-sensitive resist materials is that such a repeated imagewise irradiation of the resist layer can be carried out using only a single image-bearing transparency if the resist layer contains a mixture of sensitizers which can be activated by actinic radiation of different wavelengths, and the different imagewise parts of the said transparency are each transparent or opaque only to actinic radiation of particular wavelengths.

The resist images produced by the above process, using the novel radiation-sensitive resist layers based on the poly(diacetylenes) are suitable for all purposes for which imagewise structured resist layers are conventionally employed, for example as etch resists and plating resists in the production of circuit paths and printed circuits, for the production of thin-film or multi-film circuits and electronic components, in semiconductor technology, etc. The resist images produced according to the invention possess good mechanical and chemical stability and, when heat-activable sensitizers are not present, also good thermal stability. According to the invention, high resolution can be achieved, so that very fine image elements are reproduced faithfully to the original in the resulting resist image. Another advantage is the fact that the resist layers employed according to the invention are very suitable for exposure to actinic radiation over a very wide wavelength range, i.e. over the entire range from the far ultraviolet range to the infrared range. This makes the novel resist materials very widely and generally useful, and permits great variation in the production of the resist images. The resist layers employed according to the invention possess high optical transparency despite their partial crystallinity. The fact that the imagewise irradiated resist layers can be developed in a dry state is also important with regard to their use.

The Examples which follow illustrate the invention. Parts and percentages are by weight, unless stated otherwise.

EXAMPLE 1

Deca-4,6-diyne-1,10-diol-bis(n-butoxycarbonyl-methylurethane) was polymerized by exposure to gamma-radiation (3 megarad). The crystalline poly(diacetylene) (P3BCMU), which was obtained in a yield of 30%, was of the general formula (II) where $R^1$ and $R^2$ are identical and are each the radical stated under (a) in the description. The unreacted monomer was removed from the resulting poly(diacetylene) by extraction with acetone. The resulting fibers which possessed a metallic gloss were dissolved in chloroform, and the solution was applied onto a superficially oxidized silicon disk by spin-coating so that, after drying, a partially crystalline polymer layer about 40 nm thick resulted. This poly(diacetylene) layer was exposed to a 1,000 Watt very high pressure xenon-mercury lamp for 2 minutes through an image-bearing transparency, after which the exposed parts of the poly(diacetylene) layer were washed out with acetone. The resulting resist image was faithfull to the original and had well defined contours. It was possible to etch the bared parts of the base in a conventional manner.

EXAMPLE 2

The procedure described in Example 1 was followed, except that in this case the poly(diacetylene) used was of the general formula (II) where $R^1$ and $R^2$ are identical and are each the radical (c) stated in the description. It was possible to reduce the exposure time to 30 seconds with about the same optical density in the wavelength range of the absorption maximum as in Example 1. Otherwise, the results obtained were the same as those of Example 1.

EXAMPLE 3

The procedure described in Example 1 was followed, except that in this case heating was carried out for 12 hours at 110° C. after the imagewise exposure, and the resist image was developed by means of a plasma treatment with $Ar/O_2$ plasma gas. The resulting resist image was well defined and faithful to the original, and of even better quality than that of Example 1.

EXAMPLE 4

Deca-4,6-diyne-1,10-diol-bis(n-butoxycarbonyl-methylurethane) was polymerized by means of γ radiation (3 megarad from a $^{60}$Co-γ-source). The poly(diacetylene) (P3BCMU), which was obtained in a yield of 30%, consisted of structural units of the general formula (II) where $R^1$ and $R^2$ are identical and are each the radical stated under (a) in the description. The unreacted monomer was removed from the resulting polymer by extraction with acetone. The resulting fibers, which possessed a metallic gloss, were dissolved in chloroform and the solution was applied onto a glass substrate by spin-coating in such a way that, after drying, a partially crystalline polymer layer about 10 nm thick resulted. This poly(diacetylene) layer was exposed to a 200 W HBO very high pressure mercury lamp for 4 minutes through an image-bearing transparency. The optical density of the layer at a wavelength of 550 nm decreased from 0.19 to 0.05. The exposed parts of the poly(diacetylene) layer were then washed out with acetone to give a resist image which was faithful to the original and possessed well defined contours.

EXAMPLE 5

The procedure described in Example 4 was followed, except that in this case 1% by weight of anthraquinone was added to the solution of the poly(diacetylene) in chloroform. This enabled the exposure time to be reduced to 3.25 min while achieving the same decrease in optical density at a wavelength of 550 nm as was achieved in Example 4, and obtaining a resist image of the same quality as that of Example 4.

EXAMPLE 6

The procedure described in Example 4 was followed, except that in this case 30% of the plasticizer bis(2-ethylhexyl)phthalate was added to the solution of P3BCMU in chloroform. The exposure time in this case was 7.5 min in order to achieve the same change in optical density at a wavelength of 550 nm as that achieved in Example 4.

EXAMPLE 7

The procedure described in Example 6 was followed, except that in this case 1% of anthraquinone was added to the mixture of P3BCMU and plasticizer dissolved in chloroform. It was possible to reduce the exposure time to 4.5 min, while achieving the same change in optical density as described in Example 4. A resist image of good quality was obtained.

EXAMPLE 8

The procedure described in Example 4 was followed, except that in this case the poly(diacetylene) used was P4BCMU, in which, in the general formula (II), $R^1$ and $R^2$ are identical and are each the radical stated under (b) in the description. In order to change the optical density from 0.30 to 0.13 at a wavelength of 535 nm, the resist layer had to be exposed for 3.75 min. The resist image obtained was well defined.

EXAMPLE 9

The procedure described in Example 8 was followed, except that 2% of Michler's ketone and 6% of benzophenone were added to the solution of P4BCMU in chloroform. In order to achieve the same change in the optical density as that achieved in Example 8, it was necessary to carry out exposure for only 3.25 min. The quality of the resist image was similar to that of the resist image of Example 8.

EXAMPLE 10

The procedure described in Example 4 was followed, except that in this case the poly(diacetylene) used was PTS-12, in which, in the general formula (II), $R^1$ and $R^2$ are identical and are each the radical listed under (c) in the description. In order to change the optical density from 0.17 to 0.05 at a wavelength of 490 nm, this being the change required for the development of the resist image, exposure had to be carried out for 60 sec.

EXAMPLE 11

The procedure described in Example 10 was followed, except that in this case 1% of anthraquinone was added to the solution of PTS-12 in chloroform. It was possible to reduce the exposure time to 20 sec. while achieving the same change in optical density as that achieved in Example 10. The resist image obtained was faithful to the original and of good quality.

EXAMPLE 12

The procedure described in Example 10 was followed, except that the resist film was exposed imagewise to radiation having a wavelength above 495 nm. In order to reduce the optical density of the poly(diacetylene) resist layer from 0.17 to 0.11 at a wavelength of 490 nm, the exposure had to be carried out for 25 min.

EXAMPLE 13

The procedure described in Example 12 was followed, except that 0.12% of Rhodamine 6G was added to the solution of PTS-12 in chloroform. In order to achieve the same change in the optical density as that achieved in Example 12, exposure to light of the same wavelength was necessary for only 4 minutes. The resulting resist image was similar to that of Example 11.

EXAMPLE 14

A solution of 1.3 g of P3BCMU (polymer of Example 1) and $1.6 . 10^{-2}$ mole of azobisisobutyronitrile in 1 liter of chloroform was divided into 4 parts. All four parts were heated at 45° C., one part for 10 minutes, the second part for 20 minutes, the third part for 30 minutes and the fourth part for 40 minutes. The initially reduced viscosity of the solution, i.e. 1.09 l/g, had decreased to 0.72 l/g in the first case, to 0.58 l/g in the second case, to 0.48 l/g in the third case and to 0.42 l/g in the fourth case. Using a spin-coating method in each case, a film which was about 10 nm thick when dry was applied from each of the four solutions onto a glass substrate coated with aluminum by vapor deposition. This gave resist layers possessing differentiated properties.

EXAMPLE 15

The procedure described in Example 4 was followed, except that in this case $1.1 . 10^{-3}$ mole/liter of anthraquinone and $2 . 10^{-5}$ mole/liter of Rhodamine 6G were also added to the polymer solution. Using a spin-coating method, a 20 nm thick resist layer was produced from this solution, on a glass substrate coated with aluminum by vapor deposition. This layer was first exposed imagewise through a photomask to light having a wavelength of 546 nm and was then developed. The imagewise bared aluminum-coated glass substrate was etched so that the glass was bared imagewise. The unexposed parts of the resist were exposed to ultraviolet light through a UV mask in a second imagewise exposure step, and then developed. After this second imagewise structuring, the aluminum surface could once again be treated, independently of the first etching step.

We claim:

1. A process for the porduction of a resist image on a substrate, comprising
   application of a solid radiation-sensitive resist layer onto the substrate, the said resist layer being mainly or completely composed of at least one poly(diacetylene),
   imagewise exposure of the resist layer to actinic radiation, resulting in molecular degradation of the poly(diacetylene), and
   selective removal of the irradiated parts of the resist layer with development ofthe resist image.

2. The process of claim 1, wherein the. resist layer contains a soluble poly(diacetylene).

3. The process of claim 1, wherein the radiation-sensitve resist layer is partially crystalline.

4. The process of claim 1, wherein the poly(diacetylene contains repeating units of the formula (II)

(II)

where $R^1$ and $R^2$ are identical or different and independently of one another are each an organic radical, containing 1 to 50 carbon atoms.

5. The process of claim 4, wherein, in the poly(diacetylene) possessing the repeating units of the formula (II), $R^1$ and $R^2$ contain ester, amide, sulfonate, urethane and/or urea groups.

6. The process of claim 1, wherein the radiation-sensitive resist Layer consists of the poly(diacetylene), and imagewise irradiation is carried out with actinic light having a wavelength of from 200 to 450 nm.

7. The process of claim 1, wherein the radiation-sensitive resist layer contains a sensitizer which can be activated by actinic radiation and which, after being activated by irradiation, induces or accelerates molecular degradation of the poly(diacetylene).

8. The process of claim 7, wherein the radiation-sensitive resist layer contains a sensitizer which can be activated by actinic light, and imagewise irradiation is carried out using actinic light having a wavelength of about 180–800 nm.

9. The process of claim 7, wherein the radiation-sensitive resist layer contains a heat-activable sensitizer, and imagewise irradiation is carried out using heat radiation having a wavelength longer than about 0.8 μm.

10. The process of claim 7, wherein the radiation-sensitive resist layer contains photoactivable and heat-activable sensitizers.

11. process of claim 1, wherein the radiation-sensitive resist layer is from 10 nm to 100 μm thick.

12. The process of claim 3, wherein the resist layer is subjected to a heat treatment after the imagewise irradiation and before the removal of the irradiated parts.

13. The process of claimed in claim 1, wherein the selective removal of the imagewise irradiated parts of the resist layer is carried out by means of a plasma gas.

14. The process of claim 1, wherein, after the first imagewise irradiation and development of the resist layer, the remaining parts of the resist layer are irradiated imagewise one or more times and the irradiated parts are removed, and the bared parts of the substrate can be modified after each irradiation and development process.

15. The process of claim 1, wherein the radiation-sensitve resist layer is applied as a prepared solid Layer onto the substrate, with the use of pressure and heat, and is pre-exposed uniformly for a short time before being applied.

16. The process of claim 1, wherein the resist image is after-treated by drying and/or heating the developed image.

17. The process of claim: 4, wherein at least one of the radicals R¹ and R² contain 1 or more heteroatoms from the group consisting of oxygen, nitrogen and sulfur.

18. The porcess of claim 1, wherein unreacted monomeric diacetylene has been removed from the poly(diacetylene).

19. The process of claim 5, wherein the radicals R¹ and R² are selected from the group consisting of

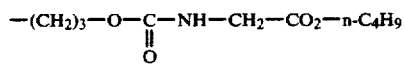 (a)

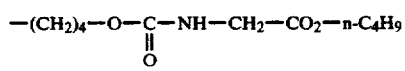 (b)

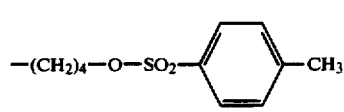 (c)

-continued

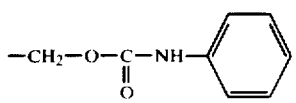 (d)

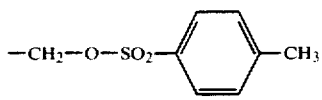 (e)

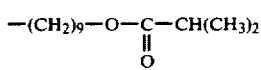 (f)

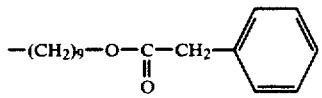 (g)

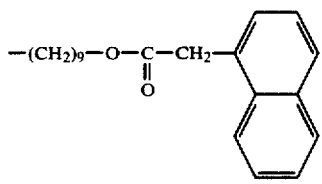 (h)

—(CH₂)₁₁—CH₃ (i)

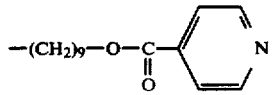 (k)

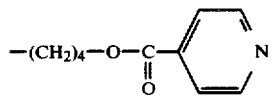 (l)

20. The process of claim 8, wherein the sensitizer that can be activated by actinic light is selected from the group consisting of xanthene dyes, thiazinium dyes, polynuclear quinones and their derivatives, and aryl ketones.

21. The process of claim 9, wherein the heat-activatable sensitizer is azobisisobutyronitrile or benzoyl peroxide.

22. The process of claim 12, wherein the resist layer does not contain a heat-activatable sensitizer.

23. The process of claim 1, wherein the resist layer contains a plasticizer.

24. The process of claim 15, wherein the resist layer contains a plasticizer.

* * * * *

UNITED STATES PATENT AND TRADEMARK OFFICE
CERTIFICATE OF CORRECTION

PATENT NO. : 4,649,100

DATED : March 10, 1987

INVENTOR(S) : LEYRER et al.

It is certified that error appears in the above-identified patent and that said Letters Patent is hereby corrected as shown below:

Column 14, line 30 [porduction] should be production.

Column 14, line 40 [ofthe] should be of the.

Column 15, line 15 [claimed in] should be deleted.

Column 15, line 38 [porcess] should be process.

Signed and Sealed this

Twenty-first Day of June, 1988

Attest:

DONALD J. QUIGG

Attesting Officer   Commissioner of Patents and Trademarks